T. H. BERKLAND
April 28, 1931.
RADIO RECEIVING CIRCUIT
Filed July 13, 1925
Original Filed July 13, 1925
Re. 18,055
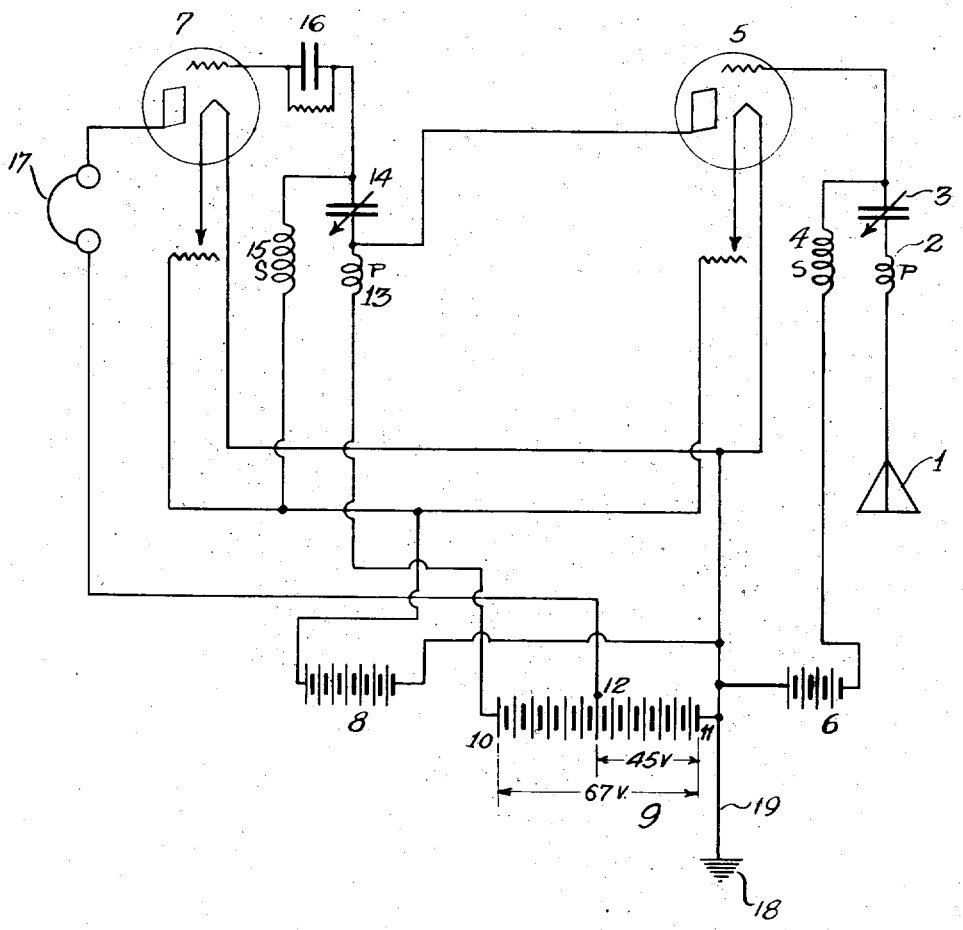
INVENTOR
Thomas H. Berkland
Charles W. Hills
BY ATTY Reissued Apr. 28, 1931

Re. 18,055

UNITED STATES PATENT OFFICE

THOMAS H. BERKLAND, OF CHICAGO, ILLINOIS, ASSIGNOR TO WESTERN ELECTRIC COMPANY, INCORPORATED, OF NEW YORK, N. Y., A CORPORATION OF NEW YORK

RADIO RECEIVING CIRCUIT

Original No. 1,679,597, dated August 7, 1928, Serial No. 43,115, filed July 13, 1925. Application for reissue filed July 31, 1930. Serial No. 472,092.

This invention relates to radio circuits and has for its object the provision of a radio circuit for receiving sets which will provide a maximum of selectivity and clearness of reception.

Other and further important objects of this invention will be apparent from the disclosures in the specification and the accompanying drawings.

This invention (in a preferred form) is illustrated in the drawings and hereinafter more fully described.

On the drawings:

The figure of the drawings represents a diagrammatic sketch of a circuit embodying the principles of this invention.

As shown on the drawings:

An antenna 1 is connected to the primary 2 of a radio frequency transformer having a variable condenser 3 in series with said primary and antenna. There is connected to the variable condenser 3 opposite to said primary 2 one terminal of a secondary coil 4 and the grid of a vacuum tube 5. Connected to the other terminal of the secondary coil 4 is the negative side of a C-battery 6. A second vacuum tube 7 is also provided, the filaments of the vacuum tubes 7 and 5 being connected in parallel through their respective resistances across an A-battery 8. A B-battery 9 is provided having sixty-seven volts across its extreme terminals 10 and 11 respectively. An intermediate terminal 12 is provided on the B-battery 9 for providing a voltage of forty-five volts. A second radio frequency transformer is provided having a primary 13, a variable condenser 14 connected to one end of said primary and a secondary 15 having one end connected to said variable condenser 14 opposite said primary. The other end of the secondary 15 is connected to the filaments of the vacuum tubes at the positive side of the A-battery 8. The other end of the primary 13 is connected to the positive side of the B-battery 9 at the terminal 10. The grid of the vacuum tube 7 is connected to the variable condenser 14 on the side opposite to the primary 13 through a grid condenser and leak 16. The plate of the vacuum tube 5 is connected to the second radio frequency transformer between the primary 13 thereof and the variable condenser 14. The negative sides of the filaments of the vacuum tubes 7 and 5 are connected to the negative side of the A-battery 8 and also to the negative terminal 11 of the B-battery 9. The negative terminal 11 of the B-battery 9 is also connected to the positive side of the C-battery 6. The plate of the vacuum tube 7 is connected to the intermediate forty-five volt terminal 12 of the B-battery 9 through a pair of phones 17, or like instrument, such as a loud speaker. The negative terminals of the A and B-batteries and the positive terminal of the C-battery are connected to ground at 18 through a suitable conductor 19 as shown.

It will be apparent that the above arrangement permits the tuning of the input and output circuits simultaneously, and that by balancing the radio frequency and audio frequency circuits, as herein disclosed, a maximum of selection and clearness of reception is obtained.

I am aware that many changes may be made, and numerous details of construction may be varied through a wide range without departing from the principles of this invention, and I therefore do not purpose limiting the patent granted hereon, otherwise than necessitated by the prior art.

I claim as my invention:

1. In a radio receiving system, a thermionic tube, the primary of a radio frequency transformer, the secondary of said radio frequency transformer, said secondary conductively connected at one end to the grid of said tube and at the other end to a grid-potential control battery, and the primary of said transformer conductively connected to the antenna at one end and capacitively connected to the grid of said tube through a variable condenser at the other end.

2. In a radio receiving system, a thermionic tube, the primary of a radio frequency transformer, the secondary of said radio frequency transformer, said secondary conductively connected to the grid of said tube at one end and to the cathode at the other end, the primary of said transformer conductively connected to the positive pole of a plate potential source at one end and capacitively connected to the grid of said tube through a variable condenser at the other end, and a conductive connection with the plate of another thermionic tube at the end of said primary at which it connects to the variable condenser.

3. In a radio system, a thermionic tube, the primary of a radio frequency transformer, the secondary of said radio frequency transformer, said secondary conductively connected to the grid of said tube at one end and to the cathode at the other end, the primary of said transformer conductively connected to the positive pole of a plate potential source at one end and capacitively connected to the grid of said tube through a variable condenser at the other end, and a conductive connection with the plate of another thermionic tube at the end of said primary at which it connects to the variable condenser.

4. In combination, an electric space discharge device having an anode and a cathode, a second electric space discharge device having a cathode and a discharge control element, and a coupling circuit for coupling said anode and said control element, said circuit comprising a transformer having primary and secondary windings and a variable condenser for connection in series with said windings, said primary winding having a terminal connected to said anode, said secondary winding having a terminal connected to said control element, and said condenser being connected between said terminals.

In witness whereof, I hereunto subscribe my name this 24th day of July, 1930.

THOMAS H. BERKLAND.